United States Patent [19]

Kondoh

[11] Patent Number: 5,210,445
[45] Date of Patent: May 11, 1993

[54] CHANGE-OVER TYPE LOADING DEVICE ASSEMBLY
[75] Inventor: Toyoshi Kondoh, Tokyo, Japan
[73] Assignee: Tatsumi Corporation, Tokyo, Japan
[21] Appl. No.: 935,989
[22] Filed: Aug. 27, 1992
[51] Int. Cl.$^5$ .............................................. H02J 3/38
[52] U.S. Cl. .................................................. 307/57
[58] Field of Search ........................................... 307/57
[56] References Cited
U.S. PATENT DOCUMENTS
3,902,076 8/1975 Meyers et al. ...................... 307/57

Primary Examiner—Donald A. Griffin
Attorney, Agent, or Firm—Wenderoth, Lind & Ponack

[57] ABSTRACT

A change-over type of loading device assembly includes a low-voltage small-capacity type of capacity-variable type loading element in which the capacity is incrementally variable by a capacity change-over element, a transformer connected to said capacity-variable type loading element, a connecting terminal mounted on said capacity-variable type loading element or said transformer, and a plurality of fixed loading elements having the respective connecting terminals and connected in parallel with each other together with said capacity-variable type loading element. These fixed loading elements include a circuit formed by connectively combining a plurality of resistors with each other and comprising element bodies, each receiving the output power from a power generator, and change-over devices for changing one of said resistors in said circuit to another depending upon operation so as to allow the withstand voltage of said circuit to correspond to the output power from said power generator. Thus, the load tests of high-voltage large-capacity, high-voltage small-capacity, low-voltage large-capacity and low-voltage small-capacity types of power generators can be done by varying the capacity with said capacity change-over element, changing the connection of said capacity-variable loading element and said fixed loading elements and changing the connection of said resistors in said circuit with said change-over devices in said fixed loading elements.

1 Claim, 12 Drawing Sheets

CHANGE-OVER TYPE LOADING DEVICE ASSEMBLY

BACKGROUND OF THE INVENTION

1. Field of the Invention

The present invention relates to power supply testing equipment for non-utility power generators, etc. set up in high-rise buildings or other facilities in order to deal with such emergent situations as power breakdown, thereby determining whether or not they are in good condition. More particularly, this invention is concerned with a loading device assembly for a so-called dry type testing equipment in which a plurality of resistors, each made of a metal member, are used for testing purposes without recourse to resistance water at all.

Generally, power generators are broken down into high-voltage large-capacity, high-voltage small-capacity, low-voltage large-capacity and low-voltage small-capacity types. In the present disclosure, power generators having a voltage of 6.6 KV or 3.3 KV and a capacity of 800 KW or higher are called the high-voltage large-capacity type, while those having a voltage of 6.6 KV or 3.3 KV and a capacity of 500 KW or less are referred to as the high-voltage small-capacity type.

Similarly, power generators having a voltage of 415 V or 200V and a capacity of 800 KW or more are called the low-voltage large-capacity type, while those having a voltage of 415 V or 200 V and a capacity of 500 KW or less are referred to as the low-voltage small-capacity type.

2. Prior Art

Referring now to FIG. 11, there is a typical power supply testing system used so far for non-utility power generators. As illustrated, a rectangular tank 71, through which a current passes, is charge with resistance water 72 of about 20° C. While three pairs of vertically movable electrode plates 73 and 73 extending in three directions are immersed in the water 72, power is then supplied from a non-utility power generator (not shown) between the electrode plates 73 and 73 for the required time to test and confirm its performance such as its power generating capability or its serviceability.

Referring typically to the testing procedure of this type of testing equipment, there is constantly a current of about 642.6 A, when power is supplied from a non-utility power generator working at an output of 1000 KVA, a power factor of 0.8 and a voltage of 415 V between the electrode plates 73 and 73 in the tank 71.

This power generator may be determined to have given power generating capability and serviceability, if there is no fault in its performance when power supply is continued for a given time in a matter of 3 hours.

However, the resistance water 72 in the tank 71 increases in temperature due to power supply and reaches as high as about 80° C. when it overflows a drainage port 75, as illustrated.

To what degree currents are passed between the electrode plates 73 and 73 through the resistance water 72 is greatly affected by the temperature rise or fall of the resistance water 72 and the degree of contamination of the resistance water 72. This in turn leads to a variation in the preset testing conditions, say, an output of 1000 KVA, a power factor of 0.08, a voltage of 415 V and a current of 642.6 A, under which the non-utility power generator works to supply power between the electrode plates 73 and 73 in the tank 71, thus resulting in a current exceeding 642.6 A flowing through the tank 71.

For that reason, there is often an overload on the generator and the associated engine.

Thus, the conventional testing equipment is designed to keep a current passing through it from exceeding a preset value of 642.6 A. For instance, this is achieved by moving the electrode plates 73 vertically to regulate the current-passing areas thereof in the resistance water 72 or supply an additional amount of fresh, low-temperature resistance water 72 through a water supply port 74, thereby limiting the temperature rise of the resistance water 72 in the tank 71.

However, the conventional testing equipment mentioned above is of size of large that it is very inconvenient to carry to where the power generator testing is needed and much time and labor are needed until it is set up.

No precise control of the electrode plates 73 is achieved as well, because much difficulty is involved in their vertical movement.

Another grave problem with this equipment is that it needs a continuous supply of fresh resistance water 72, which must immediately be discarded. Not only is the use of such a large quantity of water economically unfavorable, but the resistance water 72, once used, must be incontinently discharged as well, thus making working environment worse.

In order to provide a solution to the above problems, we have already come up with a small, economical and safe testing system which can test a non-utility power generator regardless of where it is set up, prevent an unusual current increase during testing by simple operation and make good use of resistance water, as set forth in JP-A-62-204866, JP-A-1-202554, JP-A-2-82183, JP-A-2-89754, JP-A-2- 2-249798, JP-A-2-86755, JP-A-3-76270 and JP-A-3-100180.

As illustrated schematically in FIG. 12, this testing system is built up of a tank 81 charged therein with a resistance liquid 86, a plurality of electrodes 82, each being fixed at one end on the upper portion of the tank 81, extending downwardly through the tank 81 and immersed in the resistance liquid 86 for receiving power from the non-utility power generator to be tested, a plurality of movable insulators 83, each being disposed in the tank 81 for making the quantity of a current through the electrode 82 variable, and a fan for feeding air forcedly onto the surface of a radiator 84 which serves to cool the resistance liquid 86 in the tank 81 (and onto which water is jetted from a spray pipe):

This testing system enables load tests for non-utility power generators, etc. to be done with a simplified structure but with no need of using large amounts of water.

Dissatisfied with this testing system, we have embarked on developing visionary testing equipment which can dispense with resistance water entirely, and so have now accomplished this invention.

In some cases, non-utility power generators must be set up in intermountain remote districts—that are depopulated areas, where much difficulty is encountered in providing large enough amounts of water.

In some cases, they must be tested even in snowy districts having a large snowfall, where considerable difficulty is again encountered in supplying a large quantity of water.

In particular, much difficulty is involved in making a dry type of testing equipment for testing high-voltage large-capacity generators of the order of 6.6 KV in voltage and 2000 KW in capacity. This is not only because loading devices-serving as resistance elements—made up of a metal member are imperatively of large size and cost much, but also because it is difficult to provide any fine-adjusting mechanism for setting load.

In addition, conventional dry type testing apparatus for testing low-voltage large-capacity type (with a voltage of about 200 V and a capacity of about 2000 KW), high-voltage large-capacity (with a voltage of about 3.3 KV and a capacity of about 2000 KW), low-voltage small-capacity (with a voltage of about 415 V and a capacity of about 500 W) and high-voltage small-capacity (with a voltage of about 3.3 KV and a capacity of about 500 W) types of power generators must be separately fabricated, resulting in a considerable cost rise.

A major object of this invention is to eliminate the above problems associated with conventional testing facilities by providing a loading device assembly which can be used in the absence of water, is inexpensive to assemble and allows of a simple and accurate testing of a high-voltage large-capacity power generator.

SUMMARY OF THE INVENTION

According to this invention, the above object of this invention is achieved by a loading device assembly which, as illustrated in FIG. 1, includes a low-voltage small-capacity type of capacity-variable type loading element in which the capacity is incrementally variable by a capacity change-over element, a transformer connected said capacity-variable type loading element, a connecting terminal mounted on said capacity-variable type loading element or said transformer, and a plurality of fixed loading elements having the respective connecting terminals and connected in parallel with each other together with said capacity-variable type loading element. These fixed loading elements include a circuit formed by connectively combining plurality of resistors with each other and comprising element bodies, each receiving the output power from a power generator, and change-over devices for changing one of said resistors in said circuit to another depending upon operation so as to allow the withstand voltage of said circuit to correspond to the output power from said power generator. Thus, the load tests of high-voltage large-capacity, high-voltage small-capacity, low-voltage large-capacity and low-voltage small-capacity types of power generators can be done by varying the capacity with said capacity change-over element, changing the connection of said capacity-variable loading element and said fixed loading elements and changing the connection of said resistors in said circuit with said change-over devices in said fixed loading elements.

The dry type or water-free type testing equipment of this invention may be applied to every power generator, including those of high-voltage large-capacity (a voltage of 700 V or more and a capacity of 800 KW or more-prima facie criteria), high-voltage small-capacity (a voltage of 700 V or more and a capacity of 500 KW or more-prima facie criteria), low-voltage large-capacity (a voltage of 700 V or less and a capacity of 800 KW or more-prima facie criteria) and low-voltage small-capacity (a voltage of 700 V or less and a capacity of 500 KW or less) types.

BRIEF DESCRIPTION OF THE DRAWINGS

One embodiment of the loading device assembly according to this invention will now be explained specifically but not exclusively with reference to the accompanying drawings, in which.

PREFERRED EMBODIMENT OF THE INVENTION

Figure 1:
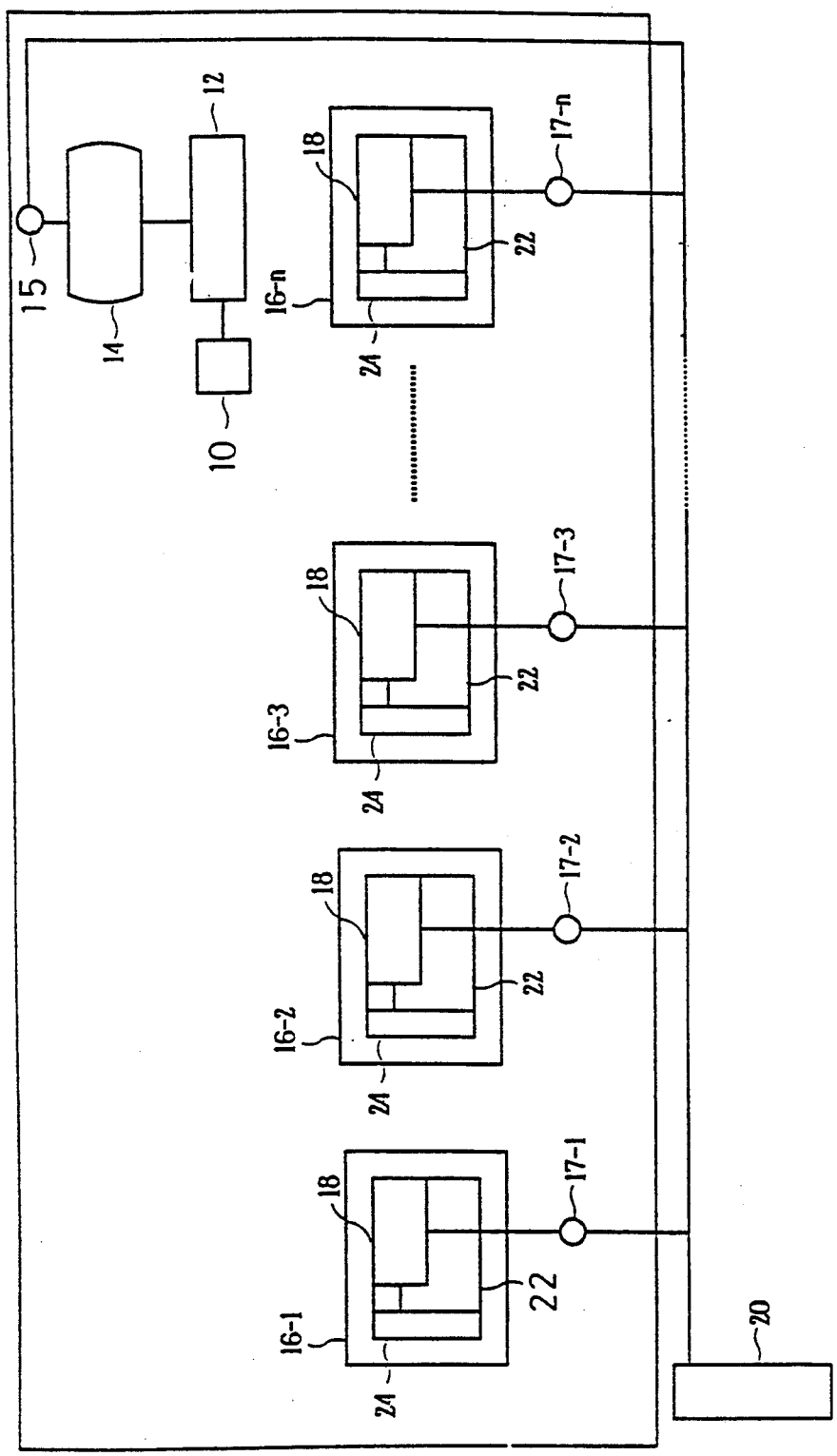
FIG. 1 represents the principles of this invention.
Figure 2:
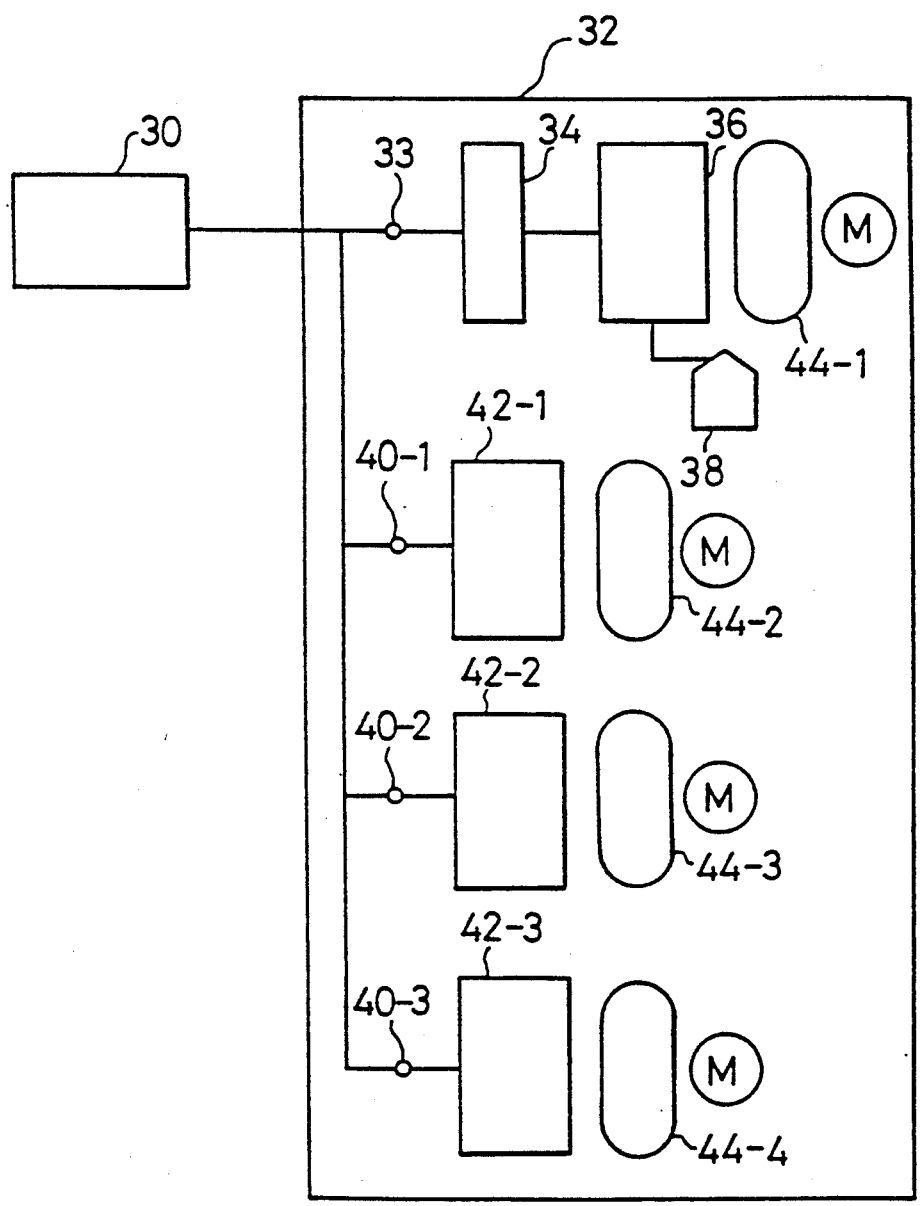
FIG. 2 illustrates the construction of one embodiment of this invention.

Referring to FIG. 2, there is shown one preferred embodiment of the loading device assembly according to this invention, in which reference numeral 30 stands for the non-utility power generator to be tested.

Connected with the power generator 30 is an loading device assembly 32.

As illustrated, the loading device assembly 32 is built up of a transformer 34 connected to the power generator 30 through a connecting terminal 33, a low-voltage small-capacity type (e.g., 415 V and 500 KW) of capacity-variable loading element 36, a load change-over element 38 provided on the element 36, a plurality of high-voltage large-capacity type (e.g., 6.6 KV and 500 KW) of fixed loading elements 42-1, 42-2 and 42-3 connected to the power generator 30 through connecting terminals 40-1, 40-2 and 40-3 and fan elements 44-1, 44-2, 44-3 and 44-4 located adjacent to the loading elements 36, 42-1, 42-2 and 42-3.

In this arrangement, the capacity-variable loading element 36 connected with the transformer 34 and the three fixed loading elements 42-1, 42-2 and 42-3 are connected in parallel with the power generator 30 through the connecting terminals 33, 40-1, 40-2 and 40-3.

The capacity-variable loading element 36 is designed to incrementally varying capacities of, for instance, 125 KW, 250 KW, 375 KW and 500 KW through the load change-over element 38.

Then, reference will be made to the construction of the fixed loading elements 42-1, 42-2 and 42-3.

Figure 3:
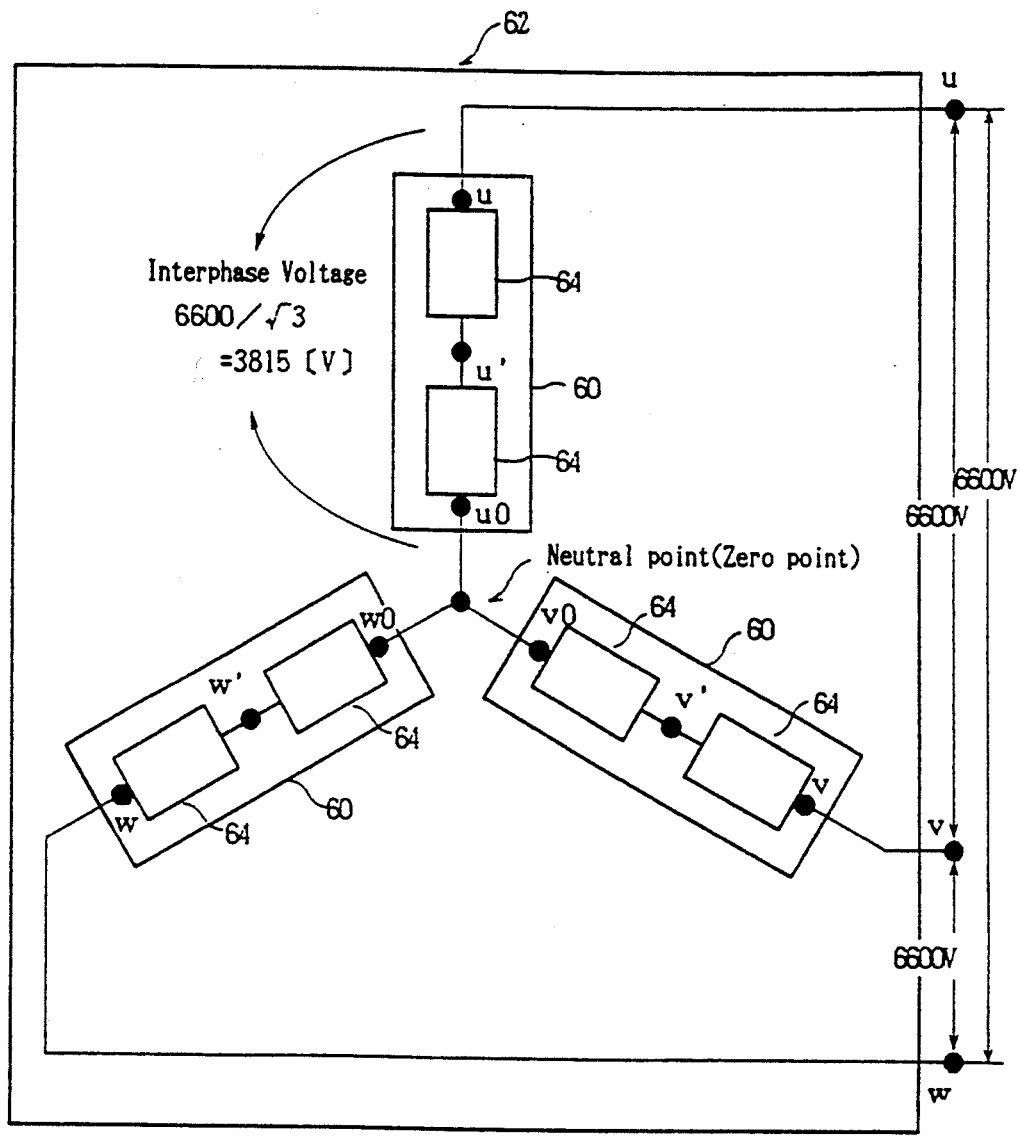
FIG. 3 is a schematic view showing the fixed loading element.
Figure 4:
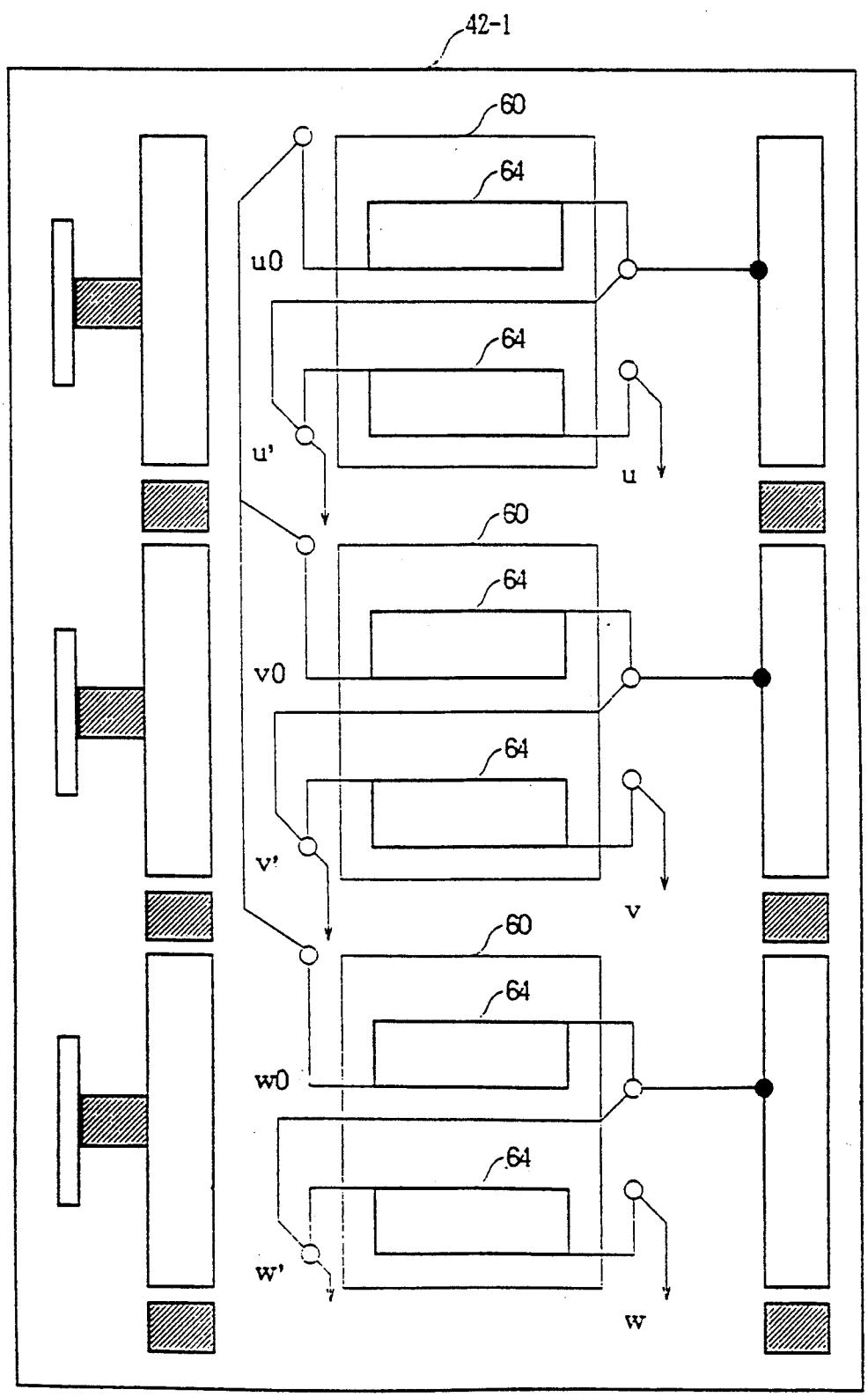
FIG. 4 is a schematic view showing the fixed loading element.

As illustrated in FIGS. 3 and 4, the fixed loading element 42-1, 42-2 and 42-3 is built up of a loading element body 62 including circuits 60 . . . .

The respective circuits 60 . . . are connected with each other through star connections. Referring to a fixed loading element of 6.6 KV as an example, the interphase voltage between the terminals u-u0 is set at 3815 V.

Figure 5:
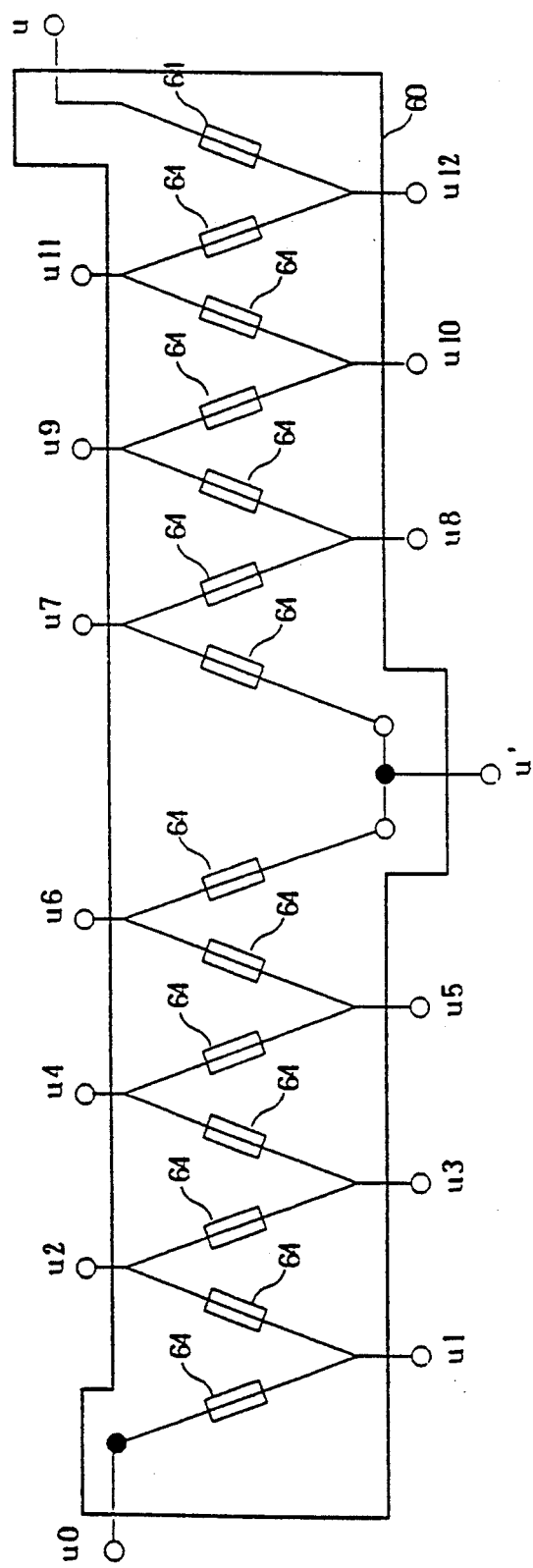
FIG. 5 is a view showing the construction of a plurality of resistors.

Referring here to the circuit 60, it is constructed by combining a plurality of resistors 64 with each other, as shown in FIG. 5.

Figure 6:
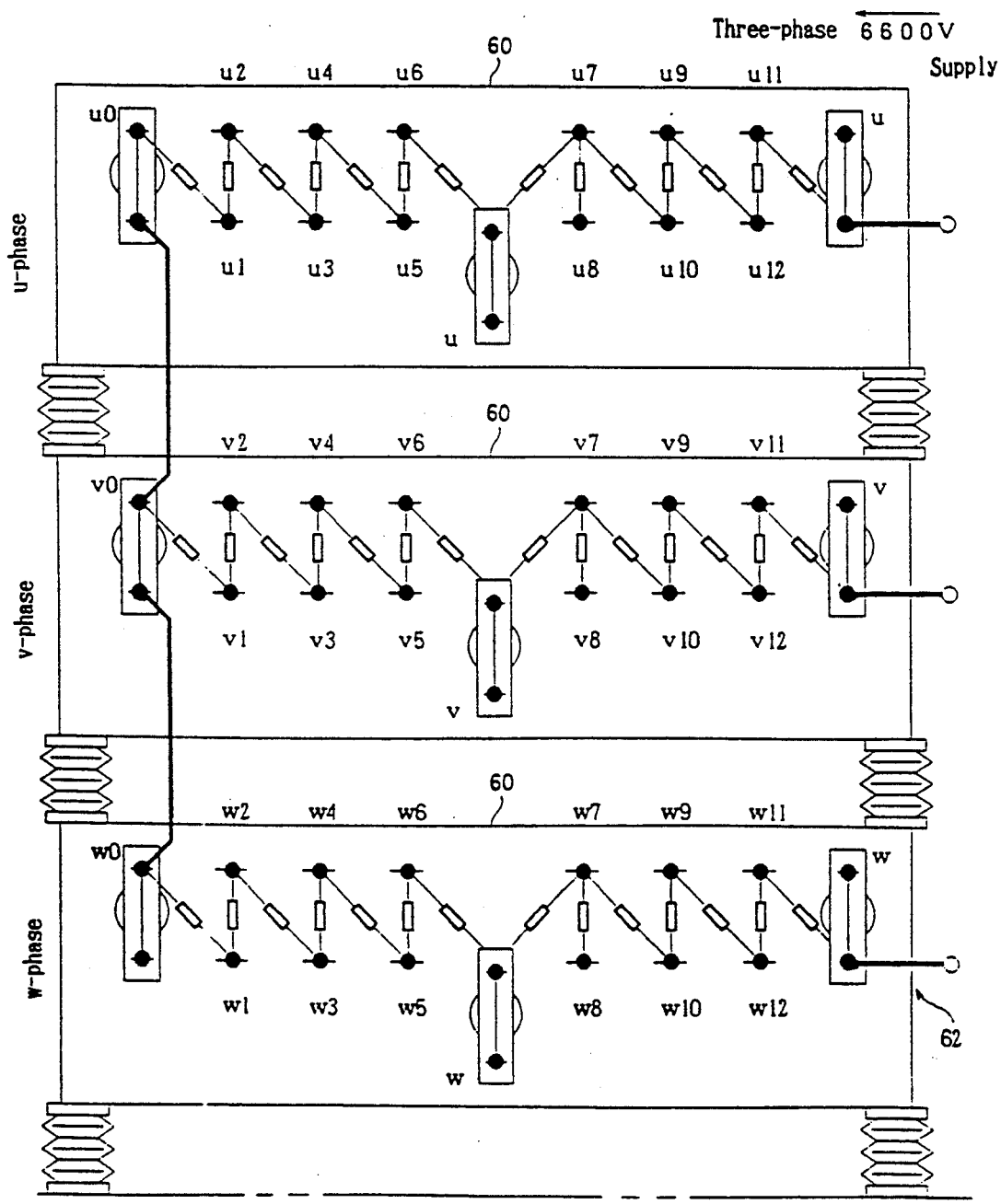
FIG. 6 is a schematic view showing the construction of the fixed loading element preset at 6.6 KV.

In the arrangement, when the fixed loading element 42-1, 42-2 or 42-3 is used at a voltage of 6.6 KV, a plurality of resistors 64 ... in the circuit 60 are connectively combined with each other as illustrated in FIGS. 4 and 6, and connecting cables extending from the power source are connected to terminals u, v and w, respectively.

Alternately, when the fixed loading element 42-1, 42-2 or 42-3 is used as 3.3 KV, a plurality of resistors 64 ... in the circuit 60 may be connectively combined with each other, while the terminal u0 and a terminal u' may be connected to the neutral point (the so-called zero point) of the star connection and the connecting terminal from the power source, respectively.

Figure 9:
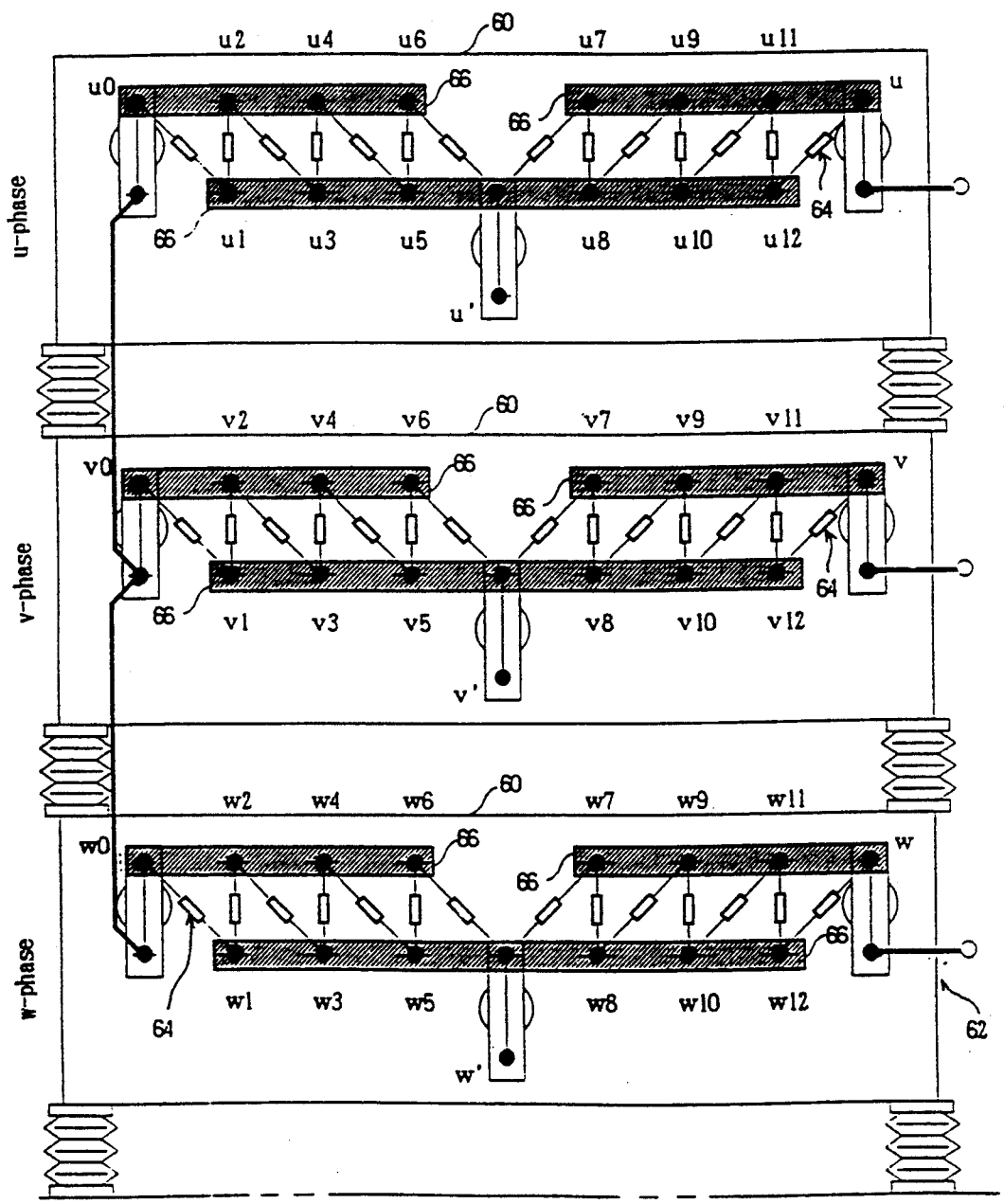
FIG. 9 is a schematic view showing the construction of the fixed loading element preset at 415 V.

Further, when it is intended to use the fixed loading element 42 at a voltage of 415 V, a plurality of resistors 64 ... may be mutually short-circuited with the use of bars 66 or cables, etc., as shown in FIG. 9, and the terminals u, v and w may then be connected to the connecting terminals from the power sources.

Figure 10:
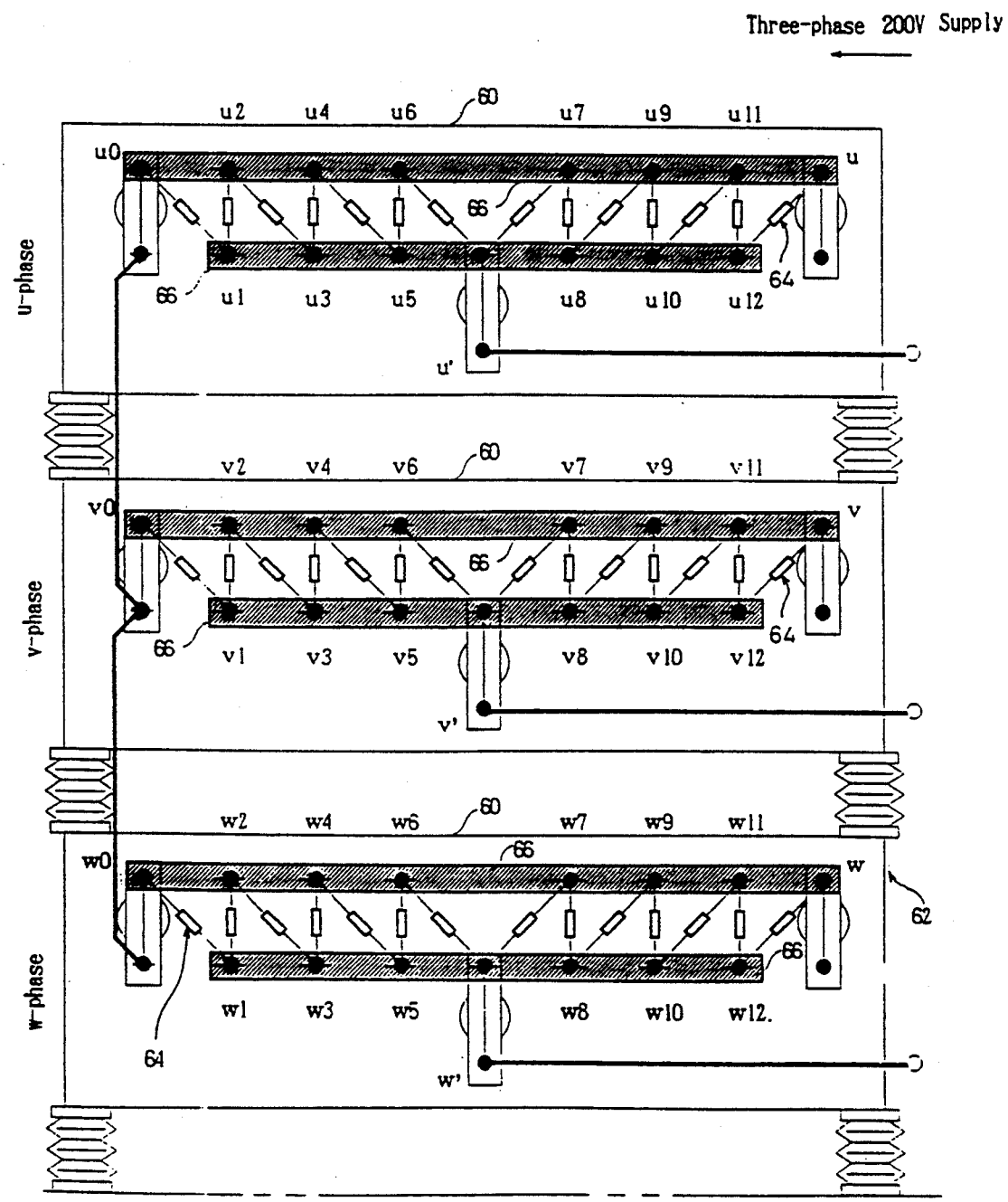
FIG. 10 is a schematic view showing the construction of the fixed loading element preset at 200 V.
Figure 11:
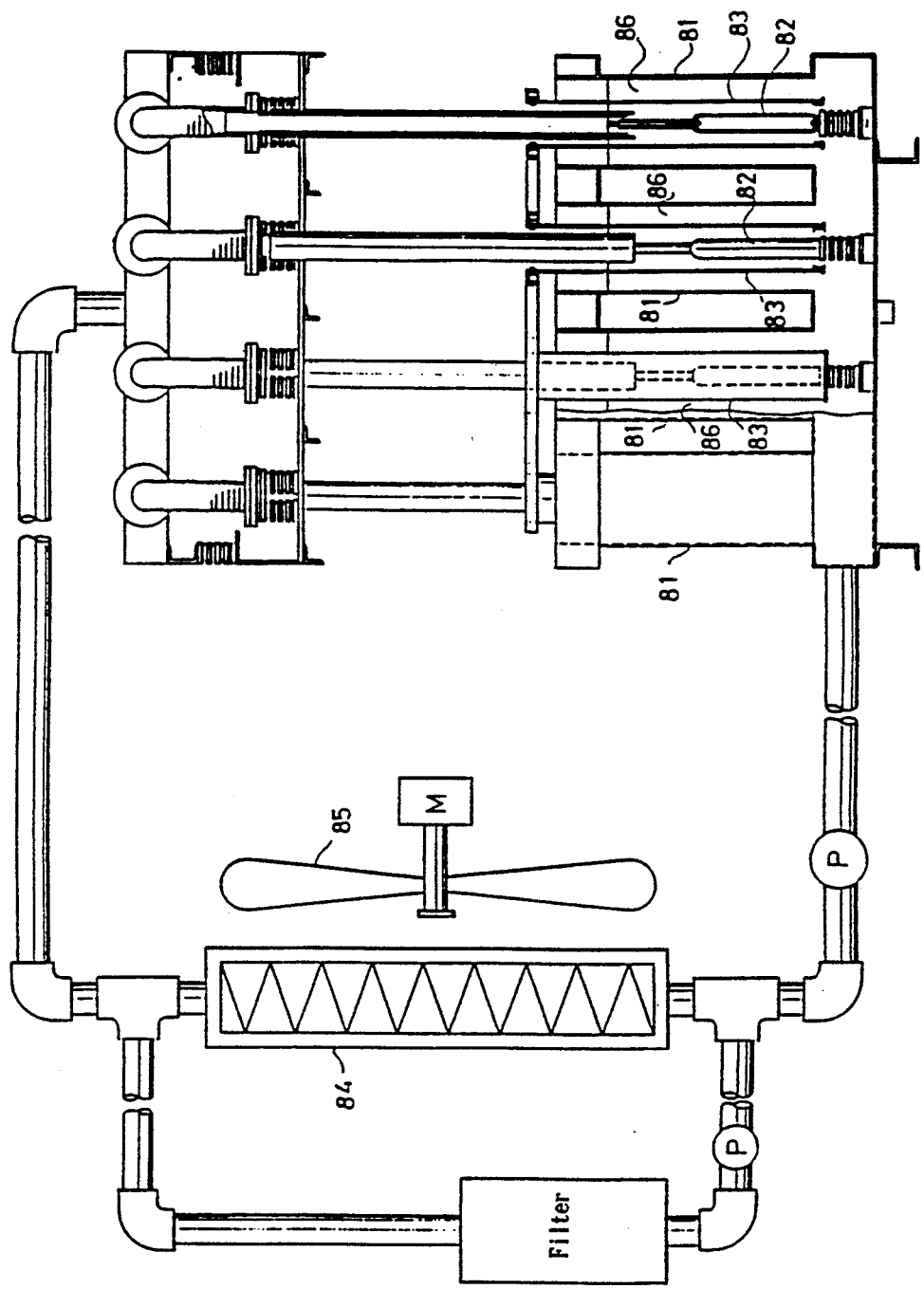
FIG. 11 is a schematic view of the example of one conventional loading device.
Figure 12:
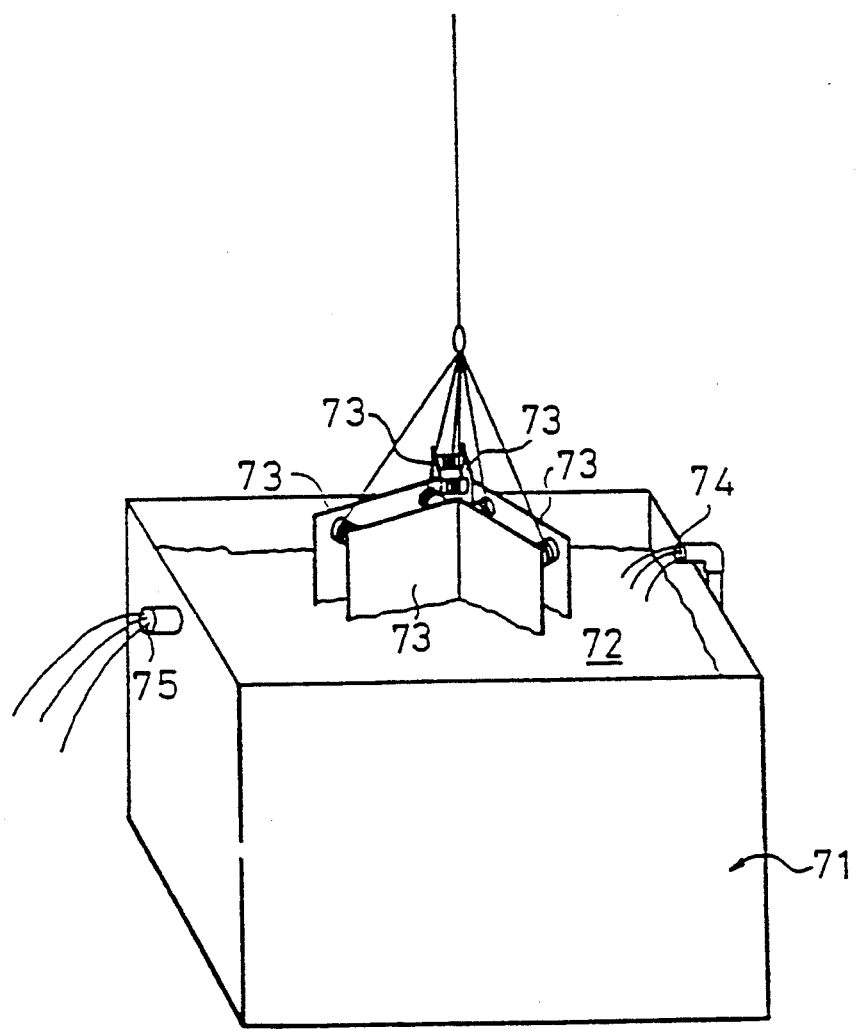
FIG. 12 is a schematic view of the example of another conventional loading device.

Still further, when it is intended to use the fixed loading element 42 at a voltage of 200 V, a plurality of resistors 64 ... may be mutually short-circuited with bars 66 or other cables in such a state as shown in FIG. 10, and the terminals u', v' and w' may then be connected to the connecting terminals from the power sources.

Thus, the combined connection of a plurality of resistors 64 in the circuit 60 can be easily varied depending upon what type of operation is to be done; that is, the voltage of the fixed loading element 42 can be varied rapidly and surely.

This enables the voltage values of the fixed loading elements 42-1, 42-2 and 42-3 to be easily varied without recourse to heavy transformers located adjacent thereto.

Reference will now be made to how testing is done with this embodiment. For instance, a high-voltage (6.6 KV) large-capacity (2000 KW) type of power generator is tested with the loading device assembly 32 which comprises one transformer 34, one low-voltage small-capacity type of capacity-variable loading element 36 (with a capacity of 500 KW and a voltage of 415 V) connected to the transformer 34 and three fixed loading elements 42-1, 42-2 and 42-3 (each with a capacity of 500 KW and a voltage of 6.6 KV), all connected in parallel with each other.

In this case, it is unnecessary to change over the combined connection of the resistors 64 ... in the circuit 60, because the above fixed loading elements 42-1, 42-2 and 42-3 are each preset at 6.6 KV.

The generator testing is done by a so-called load test and a so-called governor test. For the load test, a load of 500 KW is first applied at a voltage of 6.6 KV to the power generator for 10 minutes. Next is applied a further 500 KW or a total load of 1000 KW for about 10 minutes. Next is applied a further 500 KW or a total load of 150 KW for about 10 minutes. Finally applied is a further 500 KW or a total load of 2000 KW for about 3-4 hours.

As can be understood from FIG. 2, the initial 500 KW load test is carried out by connecting the connecting terminal 40-1 for the fixed loading element 42-1 placed at the second stage to the power generator 30, and the next 1000 KW load test is done by connecting the connecting terminals 40-1 and 40-2 for the second and third fixed loading elements 42-1 and 42-2 to the generator 30.

The next 1500 KW load test is carried out by connecting the connecting terminal 40-3 for the fixed loading element 42-3 located at the fourth stage to the generator 30.

Especially when the generator 30 is operated by a diesel engine, however, it is impossible to apply a 500 KW load to the generator 30 at one time for the final 2000 KW load test in consideration of protecting the diesel engine; in other words, that load must be incrementally applied to the generator 30.

For this reason, the transformer 34 and the low-voltage small-capacity type of capacity-variable loading element 36, both located at the first stage, are connected to the generator 30 through the connecting terminal 33 to increase the load thereon incrementally by operating the load changeover element 38 provided on the capacity-variable loading element 36, whereby the final load of 2000 KW is applied on the generator 30 over a period of 3-4 hours.

When testing the generator 30 which is of the high-voltage large-capacity type, it is thus always required to control the load to be applied thereon. With cost and production technique problems in mind, however, load control is now achievable only by a low-voltage small-capacity type of loading device.

According to this invention, however, such load control is well achievable by increasing the voltage of the capacity-variable loading element 36 from 415 V to 6.6 KV through the transformer 34.

How to carry out the governor test will now be explained.

The goal of this test is to determine whether there is a fault in a prime mover or power generator by loading and unloading.

For instance, the high-voltage (6.6 KV) large-capacity (1000 KW rather than 2000 KV) type of power generator 30 is tested with test equipment that is a loading device assembly 32 made up of one transformer 34, one low-voltage (415 V) small-capacity (500 KW) type of capacity-variable loading element 36 connected to the transformer 34 and one fixed loading element 41 (with a capacity of 500 KW and a voltage of 6.6 KV), all connected in parallel with each other.

In this case, the governor test is carried out by the loading and unloading of 250 KW, then 500 KW, then 750 KW and finally 1000 KW.

The first 250 KW loading and unloading are carried out while the transformer 34 and capacity-variable loading element 36 located at the first stage are connected to the generator 30 through the associated connecting terminal 33 and the capacity value is set at 250 KW by operating the load change-over element 38 provided on the capacity-variable loading element 36.

Likewise, the second 500 KW loading and unloading are done while the load of 500 KW is applied on the capacity-variable loading element 36 by operating the load change-over element 38 provided thereon.

Then, the 750 KW loading and unloading are done by the fixed loading element 42 (with a capacity of 500 KW and a voltage of 6.6 KV) and the capacity-variable loading element 36 whose capacity value is regulated to 250 KW by the load change-over element 38, both being connected in parallel with each other.

Finally, the 1000 KW loading and unloading are carried out by the fixed loading element 42-1 (with a capacity of 500 KW and a voltage of 6.6 KV) and the capacity-variable loading element 36 regulated to a maximum load of 500 KW by the load change-over element 38.

Next, how to test a high-voltage (3.3 KV) large-capacity (2000 KW) type of power generator will be explained.

The loading device assembly 32 that is testing equipment comprises one transformer 34, one low-voltage small-capacity type of capacity-variable loading element 36 (with a capacity of 500 KW and a voltage of 415 V) connected to the transformer 34 and three fixed loading elements 42 . . . (each with a capacity of 500 KW and a voltage of 6.6 KV), all connected in parallel with each other.

In this case, it is required to change over the combined connection of the resistors 64 . . . in the circuit 60, because the above fixed loading elements 42-1, 42-2 and 42-3 are each preset at 6.6 KV.

Figure 7:
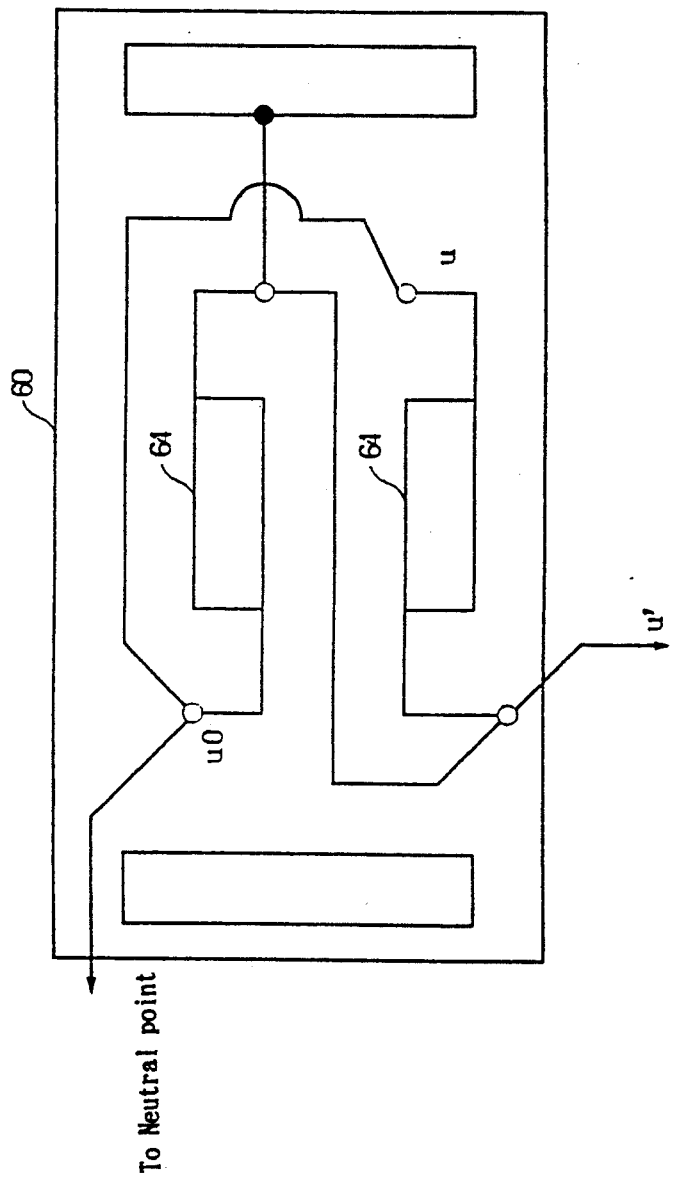
FIG. 7 is a schematic view showing the construction of the fixed loading element preset at 3.3 KV.
Figure 8:
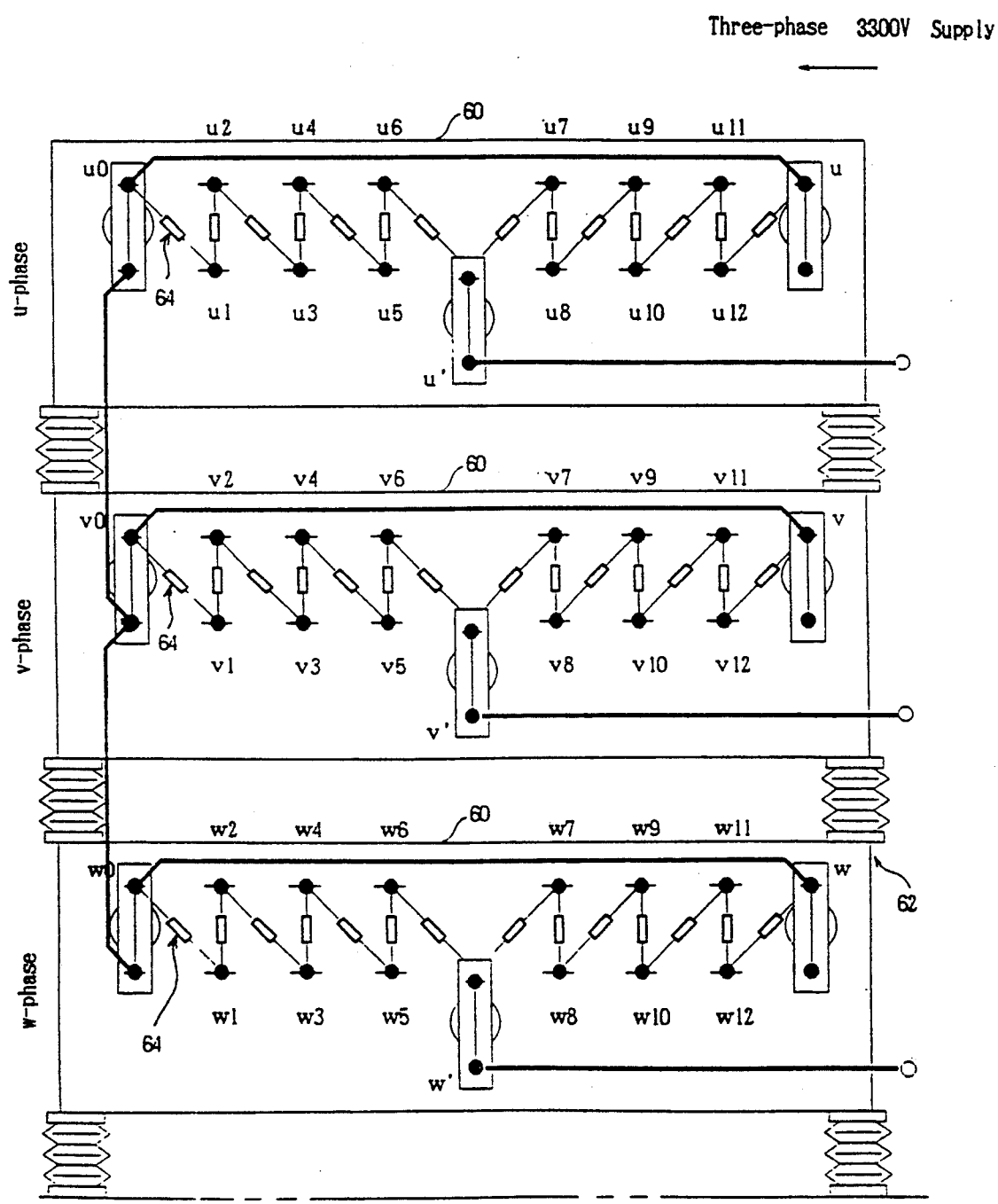
FIG. 8 is a schematic view showing the construction of the fixed loading element preset at 3.3 KV.

That is to say, the connection of the resistors 64 . . . are changed over, as shown in FIGS. 7 and 8, whereby the respective voltages of the fixed loading elements 42-1, 42-2 and 42-3 are reset at 3.3 KV.

This may be achieved by changing the 6.6 KV state shown in FIG. 6 to the 3.3 KV state shown in FIG. 8.

In this state, load testing is done.

More specifically, a load of 500 KW is first applied at a voltage of 3.3 KV to the power generator for 10 minutes. Next is applied a further 500 KW or a total load of 1000 KW for about 10 minutes. Next is applied a further 500 KW or a total load of 1500 KW for about 10 minutes. Finally applied is a further 500 KW or a total load of 2000 KW for about 3-4 hours.

As can be appreciated from FIG. 2, the initial 500 KW load test is carried out by connecting the connecting terminal 40-1 for the fixed loading element 42-1 placed at the second stage and preset at a voltage of 3.3 KV to the power generator 30, and the next 1000 KW load test is done by connecting the connecting terminals 40-1 and 40-2 for the second and third fixed loading elements 42-1 and 42-2 that is preset at a voltage of 3.3 KV - to the generator 30.

The next 1500 KW load test is carried out by connecting the connecting terminal 40-3 for the fixed loading element 42-3 located at the fourth stage and preset at a voltage of 3.3 KV to the generator 30.

It is noted, however, that it is impossible to apply a 500 KW load to the generator 30 at one time for the final 2000 KW load test; in other words, that load must be incrementally applied to the generator 30.

For this reason, the transformer 34 and the low-voltage small-capacity type of capacity-variable loading element 36, both located at the first stage, are connected to the generator 30 through the connecting terminal 33 to increase the load thereon incrementally by operating the load change-over element 38 provided on the capacity-variable loading element 36, whereby the final load of 2000 KW is applied on the generator 30 over a period of 3-4 hours.

In this case, it should be noted that the voltage of the capacity-variable loading element 36 is transformed from 415 V to 3.3 KV by the transformer 34.

Reference will now be made to the governor test.

The power generator 30 under test is a high-voltage (3.3 KV) type having a capacity of 1000 KW.

In this case, the loading device assembly 32 that is testing equipment comprises one transformer 34, one low-voltage (415 V) small-capacity (500 KW) type of capacity-variable loading element 36 connected to the transformer 34 and one fixed loading element 42 (with a capacity of 500 KW and a voltage of 3.3 KV), all connected in parallel with each other.

It is here noted that, as already mentioned, the voltage of the fixed loading element 42 is changed from 6.6 KV to 3.3 KV.

In this case, the governor test is carried out by the loading and unloading of 250 KW, then 500 KW, then 750 KW and finally 1000 KW.

The first 250 KW loading and unloading are carried out while the transformer 34 and capacity-variable loading element 36 located at the first stage are connected to the generator 30 through the associated connecting terminal 33 and the load value is set at 250 KW by operating the load change-over element 38 provided on the capacity-variable loading element 36.

Likewise, the second 500 KW loading and unloading are done while the load of 500 KW is applied on the capacity-variable loading element 36 by operating the load change-over element 38 provided thereon.

Then, the 750 KW loading and unloading are done by the fixed loading element 42 (with a capacity of 500 KW and a voltage of 6.6 KV) and the capacity-variable loading element 36 whose load value is regulated to 250 KW by the load change-over element 38, both being connected in parallel with each other.

Finally, the 1000 KW loading and unloading are carried out by the fixed loading element 42-1 (with a capacity of 500 KW and a voltage of 3.3 KV) and the capacity-variable loading element 36 regulated to a maximum load of 500 KW by the load change-over element 38.

Further reference will be made to how to test the power generator that is a low-voltage (200 V) large-capacity (200 KW) type.

Again, the loading device assembly 32 that is testing equipment comprises one transformer 34, one low-voltage small-capacity type of capacity-variable loading element 36 (with a capacity of 500 KW and a voltage of 415 V) connected to the transformer 34 and three fixed loading elements 42 . . . (each with a capacity of 500 KW and a voltage regulated to 200 V by change-over operation), all connected in parallel with each other.

In this case, it is required to change over the combined connection of the resistors 64 . . . in the circuit 60 to regulate their voltages to 200 V, because the above fixed loading elements 42-1, 42-2 and 42-3 are each preset at 6.6 KV.

That is to say, the connection of the resistors 64 . . . are short-circuited by the bars 66, as shown in FIG. 10, whereby the respective voltages of the fixed loading elements 42-1, 42-2 and 42-3 are reset at 200 V.

Thus, load testing is done after the respective voltages of the fixed loading elements are preset at 200 V.

More specifically, a load of 500 KW is first applied at a voltage of 200 V to the power generator for 10 minutes. Next is applied a further 500 KW or a total load of 1000 KW for about 10 minutes. Next is applied a further 500 KW or a total load of 1500 KW for about 10 minutes. Finally applied is a further 500 KW or a total load of 2000 KW for about 3-4 hours.

As can be appreciated from FIG. 2, the initial 500 KW load test is carried out by connecting the connecting terminal 40-1 for the fixed loading element 42-1 placed at the second stage to the power generator 30, and the next 1000 KW load test is done by connecting the connecting terminals 40-1 and 40-2 for the second and third fixed loading elements 42-1 and 42-2 to the generator 30.

The next 1500 KW load test is carried out by connecting the connecting terminal 40-3 for the fixed loading element 42-3 located at the fourth stage to the generator 30.

It is noted, however, that it is impossible to apply a 500 KW load to the generator 30 at one time for the final 2000 KW load test; in other words, that load must be incrementally applied to the generator 30.

For this reason, the transformer 34 and the low-voltage small-capacity type of capacity-variable loading element 36, both located at the first stage, are connected to the generator 30 through the connecting terminal 33 to increase the load thereon incrementally by operating the load change-over element 38 provided on the capacity-variable loading element 36, whereby the final load of 2000 KW is applied on the generator 30 over a period of 3-4 hours.

Reference will now be made to the governor test.

The power generator 30 under test is a low-voltage (200 V) type having a capacity of 1000 KW.

In this case, the loading device assembly 32 that is testing equipment comprises one transformer 34, one low-voltage (415 V) small-capacity (500 KW) type of capacity-variable loading element 36 connected to the transformer 34 and one fixed loading element 42 (with a capacity of 500 KW and a voltage of 200 V), all connected in parallel with each other.

In this case, the governor test is carried out by the loading and unloading of 250 KW, then 500 KW, then 750 KW and finally 1000 KW.

The first 250 KW loading and unloading are carried out while the transformer 34 and capacity-variable loading element 36 located at the first stage are connected to the generator 30 through the associated connecting terminal 33 and the load value is set at 250 KW by operating the load change-over element 38 provided on the capacity-variable loading element 36.

Likewise, the second 500 KW loading and unloading are done while the load of 500 KW is applied on the capacity-variable loading element 36 by operating the load change-over element 38 provided thereon.

Then, the 750 KW loading and unloading are done by the fixed loading element 42 (with a capacity of 500 KW and a voltage of 200 V) and the capacity-variable loading element 36 whose load value is regulated to 250 KW by the load change-over element 38, both being connected in parallel with each other.

Finally, the 1000 KW loading and unloading are carried out by the fixed loading element 42-1 (with a capacity of 500 KW and a voltage of 200 V) and the capacity-variable loading element 36 regulated to a maximum load of 500 KW by the load change-over element 38.

Even for such tests as mentioned above, it is required to regulate the loads to be applied; that is, of great importance is the capacity-variable loading elements 36 connected to the power generator 30 through the transformer 34.

Note that of importance during testing is to cool the loading elements 36, 42-1, 42-2 and 42-3 by the associated fans 41-1, 41-2, 41-3 and 41-4 located adjacent to them, because of their temperature increase.

Also note that the loading device assembly is premounted on the bed of a vehicle because it is often carried to where power generator testing is needed.

Thus, the tests of every power generator including those of high-voltage (6.6 or 3.3 KV) large-capacity (1000 or 2000 KW), high-voltage (6.6 or 3.3 KV) small-capacity (500 KW), low-voltage (415 or 200 V) large-capacity (1000 or 2000 KW) and low-voltage (415 or 200 V) small-capacity (500 KW) types can be safely, rapidly and precisely done with a single test equipment by selectively changing one of a plurality of resistors to another, which are incorporated in the loading device assembly according to the above-mentioned embodiment.

According to this invention explained above, the tests of every power generator including those of high-voltage (6.6 or 3.3 KV) large-capacity (1000 or 2000 KW), high-voltage (6.6 or 3.3 KV) small-capacity (500 KW), low-voltage (415 or 200 V) large-capacity (1000 or 2000 KW) and low-voltage (415 or 200 V) small-capacity (500 KW) types can be safely, rapidly and precisely done with a single test equipment by selectively changing one of a plurality of resistors to another, which are incorporated in the present loading device assembly.

What is claimed is:

1. A change-over type of loading device assembly including:

a low-voltage small-capacity type of capacity-variable type loading element in which the capacity is incrementally variable by a capacity change-over element, a transformer connected to said capacity-variable type loading element, a connecting terminal mounted on said capacity-variable type loading element or said transformer, and a plurality of fixed loading elements having the respective connecting terminals and connected in parallel with each other together with said capacity-variable type loading element, said fixed loading elements including a circuit formed by connectively combining a plurality of resistors with each other and comprising element bodies, each receiving the output power from a power generator, and change-over devices for changing one of said resistors in said circuit to another depending upon operation so as to allow the withstand voltage of said circuit to correspond to the output power from said power generator, whereby the load tests of high-voltage large-capacity, high-voltage small-capacity, low-voltage large-capacity and low-voltage small-capacity types of power generators can be done by varying the capacity with said capacity change-over element, changing the connection of said capacity-variable loading element and said fixed loading elements and changing the connection of said resistors in said circuit with said change-over devices in said fixed loading elements.

* * * * *